(12) United States Patent
Sakaki et al.

(10) Patent No.: US 7,965,020 B2
(45) Date of Patent: Jun. 21, 2011

(54) PIEZOELECTRIC CERAMIC AND PIEZOELECTRIC ELEMENT

(75) Inventors: Chiharu Sakaki, Otsu (JP); Emi Shimomura, Kawasaki (JP); Motoyoshi Sakai, Yasu (JP); Motonori Nakamura, Yasu (JP)

(73) Assignee: Murata Manufacturing Co., Ltd., Nagaokakyo-shi, Kyoto-fu (JP)

( * ) Notice: Subject to any disclaimer, the term of this patent is extended or adjusted under 35 U.S.C. 154(b) by 83 days.

(21) Appl. No.: 12/426,469

(22) Filed: Apr. 20, 2009

(65) Prior Publication Data

US 2009/0200898 A1 Aug. 13, 2009

Related U.S. Application Data

(63) Continuation of application No. PCT/JP2008/051872, filed on Feb. 5, 2008.

(30) Foreign Application Priority Data

Feb. 7, 2007 (JP) .................................. 2007-027990

(51) Int. Cl.
  *H01L 41/08* (2006.01)
(52) U.S. Cl. ...................................... 310/358
(58) Field of Classification Search .................. 310/328, 310/358; 252/62.9 PZ; *H01L 41/08*
  See application file for complete search history.

(56) References Cited

U.S. PATENT DOCUMENTS

| | | | | |
|---|---|---|---|---|
| 3,519,567 A | * | 7/1970 | Akashi et al. | 252/62.9 PZ |
| 3,594,321 A | * | 7/1971 | Ohno et al. | 2/62.9 PZ |
| 3,595,795 A | * | 7/1971 | Tsubouchi et al. | 2/62.9 PZ |
| 3,637,506 A | * | 1/1972 | Tanizake et al. | 252/62.9 PZ |
| 3,767,579 A | * | 10/1973 | Tsubouchi et al. | 252/62.9 PZ |
| 6,806,625 B2 | | 10/2004 | Ogawa et al. | |
| 2007/0252483 A1 | | 11/2007 | Yamamoto et al. | |

FOREIGN PATENT DOCUMENTS

| | | |
|---|---|---|
| DE | 41 27 829 A1 | 8/1991 |
| JP | 60-215568 | 10/1985 |
| JP | 62 089372 A | 4/1987 |
| JP | 02-301174 | 12/1990 |
| JP | 03-040965 | 2/1991 |
| JP | 05-058729 | 9/1993 |
| JP | 07-041363 | 10/1995 |
| JP | 10-287469 | 10/1998 |
| JP | 2001-181033 | 7/2001 |
| JP | 2001-181037 | 7/2001 |
| JP | 2001-328864 | 11/2001 |
| JP | 2004-059335 | 2/2004 |
| JP | 2004-307320 | 11/2004 |
| JP | 2006-052107 | 2/2006 |
| WO | WO-2006/075449 A1 | 7/2006 |
| WO | WO-2006/129434 A1 | 12/2006 |

OTHER PUBLICATIONS

Database WPI, Week 198722, Thomas Scientific, London, GB; AN 1987-153016, XP002618331, & JP 62 089372 A, Apr. 23, 1987.

* cited by examiner

*Primary Examiner* — Thomas M Dougherty
*Assistant Examiner* — Karen Addison
(74) *Attorney, Agent, or Firm* — Dickstein Shapiro LLP

(57) ABSTRACT

A piezoelectric ceramic which has a large value of coercive electric field and, in addition, which can be fired at low temperatures of 950° C. or lower, is provided. It has a composition represented by $Pb_{x-a-d}Bi_a M3_d\{M1_b(M2_{1/3}Nb_{2/3})_y Zr_{1-b-y-z}Ti_z\}O_3$ where M1 and M2 represent, independently, at least one of Ni and Zn, and M3 represents at least one of Ba and Sr, $0.05 \leq a \leq 0.15$, $0 < b \leq 0.075$, $0 \leq (a-2b)$, $0 \leq d \leq 0.1$, $0.97 \leq x \leq 1.00$, $0.020 \leq y \leq 0.250$, and $0.398 \leq z \leq 0.512$. It is preferable that M1 represents Ni, and M2 represents at least one of Ni and Zn. Moreover, it is preferable that Ni is in the state of being segregated.

20 Claims, 1 Drawing Sheet

PIEZOELECTRIC CERAMIC AND PIEZOELECTRIC ELEMENT

This is a continuation of application Serial No. PCT/JP2008/05172, filed Feb. 5, 2008.

TECHNICAL FIELD

The present invention relates to piezoelectric ceramic used for a piezoelectric actuator, an ultrasonic transducer, a piezoelectric sounder, and the like and a piezoelectric element including the piezoelectric ceramic.

BACKGROUND ART

For piezoelectric ceramics used for piezoelectric elements, e.g., piezoelectric actuators, ultrasonic transducers, piezoelectric sounders, and the like, lead zirconate titanate (PZT) based piezoelectric ceramic capable of obtaining a large piezoelectric constant has been used widely. Furthermore, in order to improve the characteristics of the PZT based piezoelectric ceramic, many types of three-component piezoelectric ceramics containing the third component have been developed.

The piezoelectric ceramic represented by $PbTiO_3$—$PbZrO_3$—$Pb(M2_{1/3}Nb_{2/3})O_3$ (where M2 represents a divalent metal element, e.g., Ni or Zn) has been noted as the three-component piezoelectric ceramic.

For example, Patent Document 1 describes a ferroelectric ceramic having a basic composition composed of 43.5 percent by mole of $PbTiO_3$, 44.0 percent by mole of $PbZrO_3$, and 12.5 percent by mole of $Pb(Zn_{1/3}Nb_{2/3})O_3$ and containing small amounts of Bi and Zn to realize a ferroelectric ceramic capable of obtaining a good temperature coefficient of dielectric constant and having improved sinterability.

Furthermore, Patent Document 2 describes a piezoelectric ceramic composition containing a composition represented by $(Pb_uA_{1-u})_v\{(Zn_{1/3}Nb_{2/3})_xTi_yZr_z\}_{2-v}O_3$, 0.7 to 3 percent by mole of Mn in terms of $MnO_2$ relative to the above-described composition, 0.7 to 2.4 percent by mole of Al in terms of $Al_2O_3$ relative to the above-described composition, and 0.1 to 1.5 percent by mole of Si in terms of $SiO_2$ relative to the above-described composition, where in the above-described composition formula, A represents at least one element selected from the group consisting of La, Nd, Pr, and Bi, u and v satisfy $0.92 \leq u \leq 0.99$ and $0.97 \leq v \leq 1.03$, respectively, and x, y, and z satisfy $0.06 \leq x \leq 0.18$, $0.43 \leq y \leq 0.53$, $0.29 \leq z \leq 0.51$, respectively, and the relationship represented by $x+y+z=1$ is satisfied, as a piezoelectric ceramic component which can be fired at a temperature of lower than 1,150° C., which has a large qm, and which exhibits a small reduction in qm due to high electric field driving.

Patent Document 1: Japanese Unexamined Patent Application Publication No. 3-40965
Patent Document 2: Japanese Unexamined Patent Application Publication No. 2001-181037

DISCLOSURE OF INVENTION

Problems to be Solved by the Invention

The amount of strain of a piezoelectric ceramic is represented as a product ($|d| \times E$) of the absolute value of piezoelectric constant d and a driving electric field E. Therefore, it is effective to improve the piezoelectric constant d and, in addition, increase the driving electric field E in order to obtain a large amount of strain. However, when the piezoelectric elements, e.g., piezoelectric sounders, are used and an alternating current electric field is applied, depolarization occurs when the piezoelectric element is driven at a field strength more than or equal to a coercive electric field (Ec). Therefore the value of driving electric field E is limited to the coercive electric field Ec or less. Consequently, it is preferable that the piezoelectric ceramic used for a piezoelectric element for uses in which an alternating current electric field is applied has a large piezoelectric constant d and, in addition, a large coercive electric field Ec.

Furthermore, the piezoelectric element may be produced by cofiring the piezoelectric ceramic and internal electrodes. At that firing time, the internal electrode is required to have a melting point higher than the firing temperature of the piezoelectric ceramic, and Pd or the like having a high melting point is used in the internal electrode. However, metals, such as Pd, having high melting points are expensive in general. Consequently, it is necessary that the firing temperature of the piezoelectric ceramic is lowered in order to decrease the content of expensive metals, e.g., Pd, and reduce the raw material cost. Specifically, in order to decrease the content of Pd in the internal electrode to 0% to 5% and make use of a content of relatively inexpensive Ag of 95% to 100%, it is necessary that the firing temperature of the piezoelectric ceramic is lowered to about 950° C.

According to the findings of the present inventors, the value of coercive electric field of the ferroelectric ceramic described in Patent Document 1 is not satisfactory, and depolarization occurs when a large alternating current electric field is applied. Therefore, it is difficult to obtain a large amount of displacement in uses in which an alternating current is applied. Furthermore, the firing temperature is 1,200° C. or higher and in the case where an internal electrode is provided, it is unavoidable that the content of Pd in the internal electrode is increased. Consequently, reduction in the raw material cost is difficult.

Patent Document 2 describes the piezoelectric ceramic composition which can be fired at low temperatures. However, it is difficult to conduct firing at 1,000° C. or lower, and a further lowering of firing temperature has been required.

The present invention has been made to solve the above-described problems, and it is an object to provide piezoelectric ceramic which has a large value of coercive electric field and which can be fired at low temperatures of 950° C. or lower. It is also an object to provide a piezoelectric element including this piezoelectric ceramic and being capable of obtaining a large amount of displacement in the use in which an alternating current is applied.

Means for Solving the Problems

The present inventors conducted intensive research to solve the above-described problems. As a result, the following findings were obtained with respect to PZT based piezoelectric ceramics.

First, it was found that oxygen defects were generated by allowing the B site of PZT based piezoelectric ceramic to realize an acceptor-rich composition and, thereby, a high coercive electric field was obtained. Furthermore, it was found that diffusion of substances during firing was facilitated by allowing the B site to become acceptor-rich and, thereby, the sinterability was improved and low-temperature firing became possible. On the other hand, it was found that the oxygen defects generated by allowing the B site to become acceptor-rich had a domain pinning effect and, thereby, a piezoelectric constant reduction problem was invited.

Second, it was found that a higher coercive electric field was obtained by substituting a part of Pb of the A site with Bi which functions as a donor. The reason for this is believed to be that A site defects are generated due to substitution with Bi which functions as a donor, formation of solid solution of an acceptor element with the B site is facilitated in order to achieve a charge balance between A site defects and oxygen defects and, thereby, still more acceptor elements can form a solid solution with the B site. Furthermore, it was found that a reduction in piezoelectric constant along with formation of solid solution of the acceptor element with the B site was able to be compensated by Bi substitution of the A site. This is because the A site defect formed due to Bi substitution facilitates the rotation of a domain.

Third, it was found that changes in characteristics along with changes in firing condition could be made difficult by forming solid solution of Ni serving as an acceptor element and, in addition, segregating Ni. If the firing condition is changed, the amount of vaporization of Bi is changed. Therefore, if the firing condition, e.g., the firing temperature and the firing atmosphere, fluctuates even in small amounts, the characteristics of the piezoelectric ceramic may be fluctuated significantly. The reason is believed to be that in the case where a composition and firing atmosphere condition facilitating segregation of Ni is adopted, even when changes occur in the amount of vaporization of Bi due to changes in firing condition, the electric charge compensation state between Bi and Ni in crystal grains can be maintained because of changes in the amount of segregation of Ni.

The present invention has been made on the basis of the above-described findings. A piezoelectric ceramic according to the present invention is characterized by being represented by a general formula, $$Pb_{x-a-d}Bi_aM3_d\{M1_b(M2_{1/3}Nb_{2/3})_yZr_{1-b-y-z}Ti_z\}O_3$$

(where M1 and M2 independently represent at least one of Ni and Zn, and M3 represents at least one of Ba and Sr), wherein regarding a, b, d, x, y, and z in the formula, $0.05 \leq a \leq 0.15$, $0 < b \leq 0.075$, $0 \leq (a-2b)$, $0 \leq d \leq 0.1$, $0.97 \leq x \leq 1.00$, $0.020 \leq y \leq 0.250$, and $0.398 \leq z \leq 0.512$ are satisfied.

Furthermore, the above-described piezoelectric ceramic is characterized in that regarding a and b in the formula, $0.015 \leq b \leq 0.075$ and $0 \leq (a-2b) \leq 0.02$ are satisfied.

Moreover, the above-described piezoelectric ceramic is preferably characterized in that M1 in the above-described formula represents Ni, and M2 in the above-described formula represents at least one type of Ni and Zn.

In addition, the above-described piezoelectric ceramic is characterized in that Ni is segregated.

Furthermore, a piezoelectric element according to the present invention includes a piezoelectric ceramic element assembly formed from any one of the above-described piezoelectric ceramic and internal electrodes incorporated in the piezoelectric ceramic element assembly.

ADVANTAGES

According to the present invention, a piezoelectric ceramic which can be fired at low temperatures of about 950° C. while a high piezoelectric constant is maintained and which has a high coercive electric field can be obtained in the case where the piezoelectric ceramic is represented by a general formula, $Pb_{x-a-d}Bi_aM3_d\{M1_b(M2_{1/3}Nb_{2/3})_yZr_{1-b-y-z}Ti_z\}O_3$ (where M1 and M2 independently represent at least one of Ni and Zn, and M3 represents at least one of Ba and Sr), wherein regarding a, b, d, x, y, and z in the above-described formula, $0.05 \leq a \leq 0.15$, $0 < b \leq 0.075$, $0 \leq (a-2b)$, $0 \leq d \leq 0.1$, $0.97 \leq x \leq 1.00$, $0.020 \leq y \leq 0.250$, and $0.398 \leq z \leq 0.512$ are satisfied.

Furthermore, in the case where regarding a and b in the above-described formula are $0.015 \leq b \leq 0.075$ and $0 \leq (a-2b) \leq 0.02$, the Bi substitution ratio a and the amount b of excess acceptors becomes close to 2:1 so as to achieve a charge balance. Therefore, the sinterability is improved.

In addition, Ni is segregated and, thereby, even when the firing condition, e.g., the firing atmosphere and the firing temperature, is fluctuated, the characteristics of the piezoelectric ceramic are not easily fluctuated, variations in the characteristics are reduced in mass production, and the productivity is improved.

Furthermore, when a piezoelectric element includes the piezoelectric ceramic according to the present invention, since the piezoelectric ceramic has a high piezoelectric constant and a large coercive electric field, a large amounts of strain can be obtained under an alternating current electric field. Moreover, the piezoelectric ceramic according to the present invention can be fired at low temperatures. Consequently, it is possible to decrease the Pd content in the internal electrode(s) and reduce the raw material cost in a piezoelectric element including internal electrodes cofired with the piezoelectric ceramic.

Figure 1:
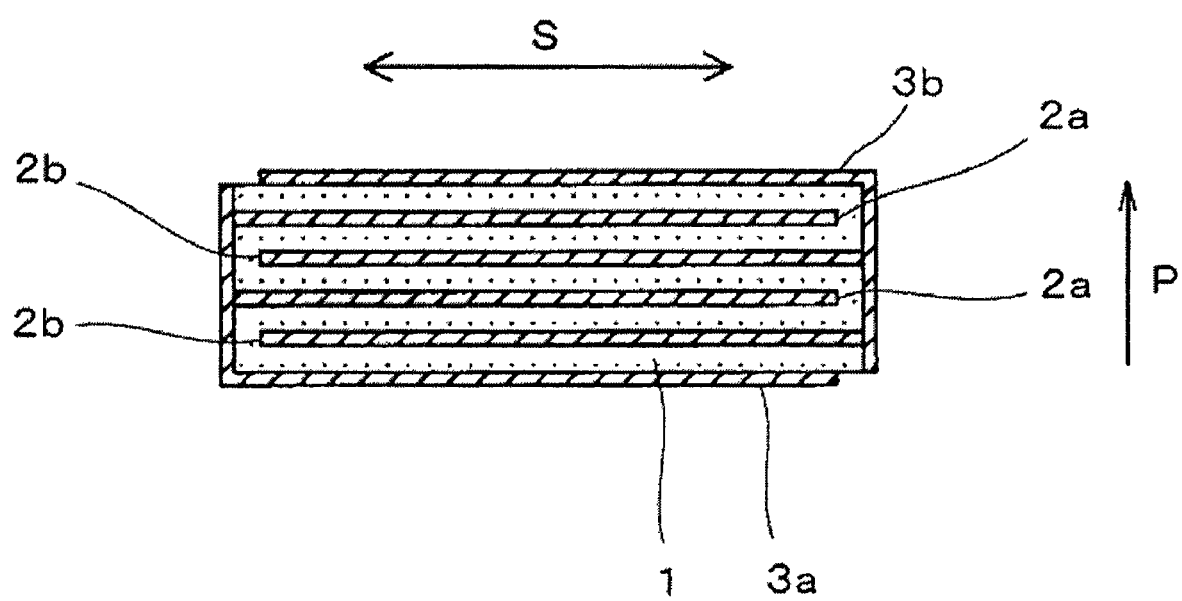
FIG. 1 is a sectional view showing a piezoelectric element according to the present invention.

REFERENCE NUMERALS 1 piezoelectric element assembly
2a and 2b internal electrode
3a and 3b external electrode

BEST MODES FOR CARRYING OUT THE INVENTION

The best modes for carrying out the present invention will be described below. A piezoelectric ceramic according to the present invention is represented by general formula (A) described below.

$$Pb_{x-a-d}Bi_aM3_d\{M1_b(M2_{1/3}Nb_{2/3})_yZr_{1-b-y-z}Ti_z\}O_3 \quad (A)$$

In General formula (A), M1 and M2 represent, independently, at least one of Ni and Zn, and M1 and M2 may be the same element or be different elements. Preferably, M1 represents Ni, and M2 represents at least one of Ni and Zn. Furthermore, M3 represents at least one of Ba and Sr.

Subscript a represents the Bi substitution ratio, and is $0.05 \leq a \leq 0.15$. If a is less than 0.05, the effect of Bi substitution is not exerted sufficiently, and the coercive electric field and the piezoelectric d constant are reduced. On the other hand, if a exceeds 0.15, the sinterability deteriorates and, as a result, the piezoelectric constant is reduced.

Subscript b represents the molar ratio of an acceptor element M1 of the B site, that is, the amount of excess acceptors of the B site, and is $0 < b \leq 0.075$. Furthermore, $0.015 \leq b \leq 0.075$ is more preferable. When b=0, the amount of excess acceptors is 0 and, therefore, the effect of the present invention is not exerted. In the case where b is specified to be 0.015 or more, the effect of the present invention is exerted more remarkably. On the other hand, if b exceeds 0.075, the coercive electric field is improved, but domain pinning effect due to oxygen defects is exerted significantly, so that the value of |d|×Ec may be reduced.

Subscripts a and b are adjusted in such a way as to satisfy $0 \leq (a-2b)$. This is because if the value of (a−2b) becomes less than 0 and takes on negative values, the amount of excess acceptors becomes too large relative to the Bi substitution ratio, oxygen defects are excessively generated, and the insulating property deteriorates.

Moreover, subscript d represents the M3 (at least one of Ba and Sr) substitution ratio of the site A, and is $0 \leq d \leq 0.1$. This is because even when the amount of substitution of M3 is 0, a piezoelectric ceramic having required characteristics can be obtained, while the piezoelectric constant can be increased by conducting M3 substitution within the range up to 0.1. However, the Curie temperature is lowered unfavorably if the amount of substitution of M3 exceeds 0.1.

Subscript x represents the molar ratio of an A site component, and is $0.97 \leq x \leq 1.00$. If x is less than 0.97, deviation of the ratio of the A site to the B site from the stoichiometric composition becomes too large, and the piezoelectric constant is reduced. On the other hand, if x exceeds 1.00, Pb and Bi, which are A site elements, are deposited at grain boundaries so as to deteriorate the insulating property.

Subscripts y and z represent molar ratios of individual components of the B site, that is, $(M2_{1/3}Nb_{2/3})$, Zr, and Ti, and a high piezoelectric constant can be obtained by employing a composition close to a morphotropic phase boundary. Therefore, $0.020 \leq y \leq 0.250$ and $0.398 \leq z \leq 0.512$ are specified.

Furthermore, $0 \leq (a-2b) \leq 0.02$ is specified and, thereby, an electrical balance between the Bi substitution ratio of the A site and the amount of excess acceptors of the B site is achieved, so that a larger value of |d|×Ec can be obtained with the piezoelectric ceramic according to the present invention.

Moreover, it is preferable that Ni is segregated in the piezoelectric ceramic according to the present invention. In the case where Ni is segregated, even when the firing condition, e.g., firing atmosphere and firing temperature, is fluctuated, the characteristics of the piezoelectric ceramic are not easily fluctuated, and variations in the characteristics are reduced in mass production. Since variations in the characteristics are reduced, there is no need to conduct screening on the basis of measurement of characteristic values after firing and, therefore, the productivity is improved significantly. In order to segregate Ni, it is effective to reduce the molar ratio x of the A site within the range of the present invention and increase an oxygen partial pressure during firing, although the means for segregating Ni is not limited to them.

FIG. 1 is a sectional view showing a piezoelectric element according to the present invention. The piezoelectric element includes a piezoelectric element assembly 1 formed from the above-described piezoelectric ceramic, internal electrodes 2a, 2b incorporated in the piezoelectric element assembly 1, and external electrodes 3a, 3b formed on surfaces of the piezoelectric element assembly 1 and electrically connected to the internal electrodes 2a and 2b. The piezoelectric element assembly 1 has been subjected to a polarization treatment in a direction indicated by an arrow P shown in the drawing. The internal electrodes 2 are formed from a Ag/Pd alloy having a ratio of Pd of 5 percent by weight or less or Ag and has been cofired with the piezoelectric element assembly 1 formed from the piezoelectric ceramic. Internal electrodes 2a connected to external electrode 3a and internal electrodes 2b connected to external electrode 3b are disposed alternately in the thickness direction.

An electric field in this piezoelectric element is generated in a direction substantially parallel to a polarization direction P by application of a voltage between the external electrodes 3a and 3b, and a strain is generated in a direction indicated by S in the drawing because of a transversal piezoelectric effect.

A method for manufacturing a piezoelectric ceramic and a piezoelectric element according to the present invention will be described below.

First, $Pb_3O_4$, $Bi_2O_3$, $ZrO_2$, $TiO_2$, NiO, ZnO, $Nb_2O_5$, $SrCO_3$, and $BaCO_3$ are prepared as raw materials. These raw material powders are weighed and mixed in such a way that general formula (A) described above is satisfied. The resulting mixed raw material is calcined at 750° C. to 930° C. so as to obtain a calcined powder. The calcined powder, a solvent, and a binder are mixed so as to produce a ceramic slurry. The resulting ceramic slurry is used in a known method, e.g., a doctor blade method to produce ceramic green sheets. The thickness of the ceramic green sheet can be set within the range of about 10 μm to 100 μm appropriately.

Next, the ceramic green sheets are cut or stamped into a desired size, an electrode paste including a metal powder and a binder is printed so as to form internal electrode patterns. As for the metal powder contained in the paste, it is preferable that Ag or a Ag/Pd alloy is used. In the case where the Ag/Pd alloy is used, it is preferable that the Pd content is specified to be 5 percent by weight or less from the viewpoint of a reduction in raw material cost.

A ceramic laminate is formed by laminating a few layers to a few tens of layers of ceramic green sheets provided with the internal electrode patterns, and conducting pressing. The resulting ceramic laminate is degreased and, furthermore, fired at about 880° C. to 1,050° C., and preferably 880° C. to 950° C., so that a piezoelectric element incorporating the internal electrodes is obtained. The resulting piezoelectric element is polished to have predetermined dimensions, and external electrodes are formed by a sputtering method, a method of baking an electrode paste, or the like. Moreover, a polarization treatment is conducted by applying a direct current electric field of 1.0 to 5.0 kV/mm between the external electrodes, so that a piezoelectric element is completed.

Regarding the piezoelectric element according to the present invention, since the value of |d|×Ec of the piezoelectric ceramic used is large, a large amount of displacement can be obtained in a use in which an alternating current electric field is applied. Furthermore, since firing can be conducted at low temperatures, the content of Pd in the internal electrode can be reduced and the raw material cost can be reduced.

According to the piezoelectric ceramic of the present invention, the internal electrode materials which can be cosintered are not limited to the Pd-containing materials, e.g., Ag/Pd, and the more inexpensive Ag can also be used. Consequently, the raw material cost can be reduced from the viewpoint of the internal electrode material as well.

Example 1

A specific example of the present invention will be described below.

First, $Pb_3O_4$, $Bi_2O_3$, $ZrO_2$, $TiO_2$, NiO, ZnO, and $Nb_2O_5$ were prepared as raw materials. These raw material powders were weighed in such a way that a predetermined composition within the range of general formula (B) was satisfied and mixing was conducted.

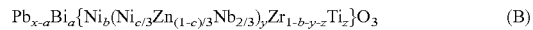
$$Pb_{x-a}Bi_a\{Ni_b(Ni_{c/3}Zn_{(1-c)/3}Nb_{2/3})_yZr_{1-b-y-z}Ti_z\}O_3 \quad (B)$$

The resulting mixed raw material was calcined at 800° C. to 850° C. so as to obtain a calcined powder. The calcined powder, water serving as a solvent, and a binder were mixed so as to produce a ceramic slurry. The resulting ceramic slurry was used to make ceramic green sheets having a thickness of about 50 μm by the doctor blade.

Next, the ceramic green sheets were stamped and an electrode paste including a metal powder formed from Ag or a Ag/Pd alloy and a binder was printed so as to form internal electrode patterns. The ratio (weight ratio) of Ag to Pd in the Ag/Pd alloy was specified to be a predetermined ratio within the range of Pd of 5 to 20 percent by weight (the remainder was Ag).

A ceramic laminate was formed by laminating 9 layers of ceramic green sheets provided with the internal electrode patterns, and conducting pressing. The resulting ceramic laminate was degreased and fired at a predetermined temperature for 8 hours, so that a piezoelectric sintered member was obtained. The resulting piezoelectric sintered member was polished to have predetermined dimensions, and Ag external electrodes were formed on front and back surfaces by an evaporation method. Moreover, a polarization treatment was conducted by applying a direct current electric field of 3.0 kV/mm between the external electrodes. After the polarization, the piezoelectric sintered member was cut into the dimensions of 13.0 mm long×3.0 mm wide×0.6 mm thick, and external electrodes were formed on end surfaces by the evaporation method, so that a piezoelectric element was completed.

The composition, the firing temperature, and the internal electrode Ag/Pd ratio (weight ratio) of each sample are shown in Table 1. In Table 1, Ag is used as the internal electrode in Examples 25 and 26 as expressed by an Ag/Pd ratio of 10/0.

Asterisked sample numbers in Table 1 (and below in Table 2) indicate comparative examples which are out of the scope of the present invention.

Regarding each of the resulting samples, a hysteresis curve of polarization due to an electric field was measured by using a ferroelectric tester (RT600HVS produced by Radiant Technologies, Inc.) on the basis of a virtual grand system. Then, the coercive electric field (Ec) was determined from this hysteresis curve. Furthermore, a contact-type displacement gauge was used and the amount of displacement of the transversal piezoelectric effect when an electric field of 500 V/mm was applied to each sample was measured, and a piezoelectric constant $|d_{31}|$ was calculated from the amount of displacement and the electric field. Moreover, the product ($|d_{31}|\times Ec$) of the piezoelectric constant $|d_{31}|$ and the coercive electric field Ec was determined. The measurement results are shown in Table 2.

TABLE 2

| Sample No. | Coercive electric field Ec (kV/mm) | Piezoelectric constant $|d_{31}|$ (pm/V) | $|d_{31}| \times Ec$ ($\times 10^{-6}$) |
|---|---|---|---|
| 1* | 1.20 | 280 | 336 |
| 2* | 1.70 | 198 | 337 |
| 3 | 1.60 | 272 | 435 |
| 4 | 1.50 | 330 | 395 |
| 5 | 1.45 | 332 | 481 |
| 6 | 1.27 | 316 | 401 |
| 7 | 1.35 | 350 | 473 |
| 8 | 1.30 | 340 | 442 |
| 9 | 1.25 | 330 | 413 |
| 10 | 1.22 | 330 | 403 |
| 11* | 1.10 | 310 | 341 |
| 12* | | Polarization was impossible | |

TABLE 1

| Sample No. | $Pb_{y-a}Bi_a\{Ni_b(Ni_{c/3}Zn_{(1-c)/3}Nb_{2/3})_xZr_{1-b-y-z}Ti_z\}O_3$ | | | | | | | Firing temperature (°C.) | Ag/Pd ratio |
|---|---|---|---|---|---|---|---|---|---|
| | a | b | c | x | y | z | a − 2b | | |
| 1* | 0.000 | 0.000 | 1.000 | 0.985 | 0.200 | 0.420 | 0.000 | 1050 | 8/2 |
| 2* | 0.170 | 0.080 | 1.000 | 0.990 | 0.015 | 0.515 | 0.010 | 1000 | 9/1 |
| 3 | 0.150 | 0.070 | 1.000 | 0.990 | 0.045 | 0.495 | 0.010 | 950 | 95/5 |
| 4 | 0.120 | 0.055 | 1.000 | 0.990 | 0.080 | 0.475 | 0.010 | 950 | 95/5 |
| 5 | 0.100 | 0.045 | 1.000 | 0.990 | 0.114 | 0.455 | 0.010 | 950 | 95/5 |
| 6 | 0.100 | 0.045 | 0.545 | 0.990 | 0.163 | 0.435 | 0.010 | 950 | 95/5 |
| 7 | 0.080 | 0.032 | 0.682 | 0.985 | 0.155 | 0.433 | 0.016 | 950 | 95/5 |
| 8 | 0.060 | 0.022 | 0.740 | 0.985 | 0.190 | 0.424 | 0.016 | 950 | 95/5 |
| 9 | 0.050 | 0.017 | 0.765 | 0.985 | 0.209 | 0.414 | 0.016 | 950 | 95/5 |
| 10 | 0.050 | 0.017 | 0.775 | 0.985 | 0.219 | 0.409 | 0.016 | 950 | 95/5 |
| 11* | 0.030 | 0.007 | 0.089 | 0.985 | 0.259 | 0.389 | 0.016 | 1000 | 9/1 |
| 12* | 0.100 | 0.045 | 1.000 | 1.010 | 0.114 | 0.455 | 0.010 | 950 | 95/5 |
| 13 | 0.100 | 0.045 | 1.000 | 1.000 | 0.114 | 0.455 | 0.010 | 950 | 95/5 |
| 14 | 0.100 | 0.045 | 1.000 | 0.980 | 0.114 | 0.455 | 0.010 | 950 | 95/5 |
| 15 | 0.100 | 0.045 | 1.000 | 0.970 | 0.114 | 0.455 | 0.010 | 950 | 95/5 |
| 16* | 0.100 | 0.045 | 1.000 | 0.960 | 0.114 | 0.455 | 0.010 | 950 | 95/5 |
| 17* | 0.080 | 0.046 | 0.682 | 0.978 | 0.154 | 0.430 | −0.012 | 950 | 95/5 |
| 18 | 0.080 | 0.039 | 0.682 | 0.978 | 0.154 | 0.430 | 0.002 | 950 | 95/5 |
| 19 | 0.080 | 0.037 | 0.682 | 0.978 | 0.154 | 0.430 | 0.006 | 950 | 95/5 |
| 20 | 0.080 | 0.032 | 0.682 | 0.985 | 0.155 | 0.433 | 0.016 | 950 | 95/5 |
| 21 | 0.084 | 0.032 | 0.682 | 0.985 | 0.155 | 0.433 | 0.020 | 950 | 95/5 |
| 22 | 0.085 | 0.032 | 0.682 | 0.985 | 0.155 | 0.433 | 0.021 | 950 | 95/5 |
| 23 | 0.080 | 0.035 | 0.800 | 0.985 | 0.250 | 0.398 | 0.010 | 950 | 95/5 |
| 24* | 0.080 | 0.035 | 0.800 | 0.985 | 0.320 | 0.380 | 0.010 | 1000 | 9/1 |
| 25 | 0.080 | 0.035 | 1.000 | 0.985 | 0.155 | 0.435 | 0.010 | 880 | 10/0 |
| 26 | 0.080 | 0.035 | 0.000 | 0.985 | 0.155 | 0.420 | 0.010 | 880 | 10/0 |
| 27 | 0.100 | 0.040 | 1.000 | 0.985 | 0.020 | 0.512 | 0.020 | 950 | 95/5 |

TABLE 2-continued

| Sample No. | Coercive electric field Ec (kV/mm) | Piezoelectric constant $\|d_{31}\|$ (pm/V) | $\|d_{31}\| \times$ Ec ($\times 10^{-6}$) |
|---|---|---|---|
| 13 | 1.45 | 284 | 412 |
| 14 | 1.54 | 295 | 454 |
| 15 | 1.53 | 287 | 439 |
| 16* | 1.55 | 166 | 257 |
| 17* | Polarization was impossible | | |
| 18 | 1.37 | 347 | 476 |
| 19 | 1.38 | 351 | 483 |
| 20 | 1.45 | 330 | 480 |
| 21 | 1.48 | 304 | 451 |
| 22 | 1.35 | 255 | 344 |
| 23 | 1.06 | 378 | 401 |
| 24* | 0.83 | 352 | 292 |
| 25 | 1.30 | 350 | 455 |
| 26 | 1.34 | 337 | 452 |
| 27 | 1.45 | 278 | 403 |

Sample 1 is out of the scope of the present invention because b=0. The coercive electric field Ec was a low 1.20 kV/mm and, as a result, the value of $\|d_{31}\| \times$Ec was a low $336 \times 10^{-6}$. In Sample 2, the value of a was 0.170 and exceeded the upper limit value of the present invention. In addition, the value of b was 0.080 and exceeded the upper limit value of the present invention. The coercive electric field was high, but the piezoelectric constant $\|d_{31}\|$ was significantly reduced to 198 pm/V. As a result, the value of $\|d_{31}\| \times$Ec was reduced to $337 \times 10^6$.

In Sample 11, the value of a was 0.030 and was lower than the lower limit value of the present invention. In addition, the value of z was 0.389 and was out of the scope of the present invention. The coercive electric field was reduced to 1.10 kV/mm. As a result, the value of $\|d_{31}\| \times$Ec was reduced to $341 \times 10^{-6}$. The value of x was 1.010 in sample 12 and exceeded the upper limit value of the present invention. The insulating property deteriorated and polarization of the piezoelectric ceramic was impossible. On the other hand, in Sample 16, the value of x was 0.960 and was lower than the lower limit value of the present invention. The value of piezoelectric constant $\|d_{31}\|$ was significantly reduced to 166 pm/V. As a result, the value of $\|d_{31}\| \times$Ec was reduced to $257 \times 10^{-6}$. In Sample 17, the value of (a−2b) was −0.012 and was lower than the lower limit value of the present invention. The insulating property deteriorated and polarization of the piezoelectric ceramic was impossible.

Furthermore, the molar ratio y of $(Ni_{c/3}Zn_{(1-c)/3}Nb_{2/3})$ of the B site in Sample 24 exceeded the upper limit value of the present invention, and low temperature sintering was difficult so that a reduction in $\|d_{31}\|$ was invited. As a result, $\|d_{31}\| \times$Ec was reduced.

On the other hand, large values of $\|d_{31}\| \times$Ec were obtained in Samples 3 to 10, 13 to 15, 18 to 23, and 25 to 27 which were within the scope of the present invention. Sample 22 was within the scope of the present invention. However, the value of (a−2b) was out of the preferable range of 0 or more and 0.02 or less. The sinterability deteriorated and the piezoelectric constant $\|d_{31}\|$ was reduced to 255 pm/V. As a result, the value of $\|d_{31}\| \times$Ec was reduced as compared with those of other samples within the scope of the present invention.

For Samples 3 to 10, 13 to 15, 18 to 21, and 25 to 27 which were within the scope of the present invention and in which the requirement of $0 \leq (a-2b) \leq 0.02$ was satisfied, compatibility between high coercive electric field and high piezoelectric constant was able to be ensured and large values of $\|d_{31}\| \times$Ec of $395 \times 10^{-6}$ or more were able to be obtained. The value of y in Sample 23 was 0.25 which was the upper limit of the scope of the present invention. Therefore, the values of piezoelectric constant and $\|d_{31}\| \times$Ec were good, as described above, although the coercive electric field was slightly low.

In addition, cross-sections of the piezoelectric elements of Samples 1 to 21 were mirror-finished and WDX mapping was conducted so as to check for occurrence of Ni segregation. As a result, Ni segregation was observed with respect to Samples 18 and 19, but Ni segregation was not observed with respect to other Samples.

Furthermore, it was ascertained that high values of $\|d_{31}\| \times$Ec were obtained with respect to both Sample 25 in which c=1 and Sample 26 in which c=0. Ag electrodes were used in these as the internal electrodes. Consequently, it is clear that Ag can be used as a cosinterable internal electrode material besides materials, e.g., Ag/Pd, in the range of c=0 to 1, for example. In addition, as is clear from the characteristics of Samples 25 and 26, that satisfactory characteristics are obtained in the case where the Ag electrode is used as the internal electrode.

In the case where the characteristics of Samples 1 to 27 are reviewed while the molar ratio y of the B site component is noted, it is clear that good characteristics are obtained by specifying the value of y to be within the range of $0.020 \leq y \leq 0.250$.

Moreover, when the characteristics of Samples 1 to 27 are reviewed while the molar ratio z of the B site component is noted, it is clear that high values of $\|d_{31}\| \times$Ec are obtained by specifying the value of z to be within the range of $0.398 \leq z \leq 0.512$.

Example 2

Example 2 of the present invention will be described below. Explanations of the parts common to those in Example 1 will not be provided.

Initially, raw material powders were weighed in such a way that a predetermined composition ratio was obtained within the range of general formula (B) described above in a manner similar to that in Example 1. Mixing and calcination were conducted so as to produce a calcined powder. Then, a piezoelectric element was produced by using the resulting calcined powder in a manner similar to that in Example 1. The firing temperature was to be 900° C. For each composition, samples were prepared by conducting firing in air (oxygen content 20%), in nitrogen (oxygen content 0.5%), and in oxygen (oxygen content 100%), respectively, at 1 atmosphere.

For each sample, the piezoelectric constant $\|d_{31}\|$ was measured in a manner similar to that in Example 1. Furthermore, the sample fired in air was taken as a reference, and a rate of change of the piezoelectric constant $\|d_{31}\|$ of the sample fired in nitrogen or in oxygen was determined. In addition, a cross-section of the piezoelectric element was mirror-finished and WDX mapping was conducted with respect to the Ni element so as to check for occurrence of Ni segregation.

The composition, the firing temperature, and the internal electrode Ag/Pd ratio of each sample are shown in Table 3, and the measurement results are shown in Table 4. In Table 4, the column "Piezoelectric constant $\|d_{31}\|$ at Air" shows a value of piezoelectric constant $\|d_{31}\|$ in the case where firing was conducted in air. Asterisked Sample number 28 in Table 3 and Table 4 indicates a comparative example which is out of the scope of the present invention.

TABLE 3

| Sample No. | \multicolumn{7}{c}{$Pb_{x-a}Bi_a\{Ni_b(Ni_{c/3}Zn_{(1-c)/3}Nb_{2/3})_yZr_{1-b-y-z}Ti_z\}O_3$} | Firing temperature (°C.) | Ag/Pd ratio |
|---|---|---|---|---|---|---|---|---|---|
|  | a | b | c | x | y | z | a − 2b | | |
| 28* | 0.081 | 0.030 | 0.683 | 0.987 | 0.155 | 0.435 | 0.021 | 900 | 95/5 |
| 29 | 0.081 | 0.032 | 0.683 | 0.985 | 0.155 | 0.435 | 0.017 | 900 | 95/5 |
| 30 | 0.076 | 0.037 | 0.683 | 0.980 | 0.155 | 0.435 | 0.002 | 900 | 95/5 |

TABLE 4

| Sample No. | Ni segregation | Piezoelectric constant $|d_{31}|$ at Air (pm/V) | Rate of change of $|d_{31}|$ (%) | |
|---|---|---|---|---|
|  |  |  | in nitrogen | in oxygen |
| 28* | none | 252 | −13 | −11 |
| 29 | none | 313 | −21 | 4 |
| 30 | observed | 310 | 3 | −1 |

As shown in Table 4, it was ascertained that in the case where the firing was conducted in air with Sample 28 which was out of the scope of the present invention, the piezoelectric constant $|d_{31}|$ was a small 252 pm/V. Furthermore, the rate of change of $|d_{31}|$ was −13% when the firing atmosphere was the nitrogen atmosphere, and the rate of change of $|d_{31}|$ was −11% when the firing atmosphere was the oxygen atmosphere. Therefore, it was made clear that the piezoelectric constant $|d_{31}|$ was significantly reduced because of a change in firing atmosphere.

Moreover, it was ascertained for Sample 29 which was within the scope of the present invention, that the piezoelectric constant $|d_{31}|$ was a high 313 pm/V in the case where the firing was conducted in air. However, Ni was not segregated, the rate of change of $|d_{31}|$ was −21% when the firing atmosphere was the nitrogen atmosphere and, therefore, it was ascertained that the piezoelectric constant $|d_{31}|$ was significantly reduced because of a reduction in oxygen partial pressure in the firing atmosphere.

On the other hand, the piezoelectric constant $|d_{31}|$ was a high 310 pm/V for Sample 30 which was within the scope of the present invention and in which Ni was segregated, when the firing was conducted in air. In addition, the rate of change of $|d_{31}|$ was 3% when the firing was conducted in the nitrogen atmosphere, and the rate of change of $|d_{31}|$ was −1% when the firing atmosphere was the oxygen atmosphere. Therefore, the piezoelectric constant $|d_{31}|$ was not easily changed even when the firing atmosphere was changed, and stable piezoelectric constant $|d_{31}|$ was able to be obtained even when there were variations in the firing condition.

Example 3

Example 3 of the present invention will be described below. Explanations of the parts common to those in Example 1 will not be provided.

Initially, $Pb_3O_4$, $Bi_2O_3$, $ZrO_2$, $TiO_2$, NiO, ZnO, $Nb_2O_5$, and $SrCO_3$ were prepared as raw materials. The raw material powders were weighed in such a way that the composition ratio shown in Table 5 was obtained within the range of general formula (C) described below. Mixing and calcination were conducted so as to produce a calcined powder.

$$(Pb_{x-a-d}Bi_aSr_d)\{Ni_b(Ni_{c/3}Zn_{(1-c)/3}Nb_{2/3})_yZr_{1-b-y-z}Ti_z\}O_3 \quad (C)$$

Asterisked Sample number 34 in Table 5 indicates a comparative example which is out of the scope of the present invention.

Then, a piezoelectric element (sample) was produced by using the resulting calcined powder in a manner similar to that in Example 1.

TABLE 5

| Sample No. | \multicolumn{8}{c}{$(Pb_{x-a-d}Bi_aSr_d)\{Ni_b(Ni_{c/3}Zn_{(1-c)/3}Nb_{2/3})_yZr_{1-b-y-z}Ti_z\}O_3$} | Firing temperature (°C.) | Ag/Pd ratio |
|---|---|---|---|---|---|---|---|---|---|---|
|  | a | d | b | c | x | y | z | a − 2b | | |
| 31 | 0.080 | 0.00 | 0.034 | 0.683 | 0.983 | 0.155 | 0.430 | 0.012 | 900 | 95/5 |
| 32 | 0.080 | 0.05 | 0.034 | 0.683 | 0.983 | 0.155 | 0.411 | 0.012 | 940 | 95/5 |
| 33 | 0.080 | 0.08 | 0.034 | 0.683 | 0.983 | 0.155 | 0.399 | 0.012 | 940 | 95/5 |
| 34* | 0.080 | 0.11 | 0.034 | 0.683 | 0.983 | 0.155 | 0.387 | 0.012 | 940 | 95/5 |
| 35 | 0.080 | 0.05 | 0.034 | 0.545 | 0.983 | 0.108 | 0.427 | 0.012 | 940 | 95/5 |
| 36 | 0.080 | 0.10 | 0.034 | 0.545 | 0.983 | 0.108 | 0.407 | 0.012 | 940 | 95/5 |

Moreover, $Pb_3O_4$, $Bi_2O_3$, $ZrO_2$, $TiO_2$, NiO, ZnO, $Nb_2O_5$, and $BaCO_3$ were prepared as raw materials (i.e., $BaCO_3$ was used instead of $SrCO_3$ described above). The raw material powders were weighed in such a way that the composition ratio shown in Table 6 was obtained within the range of general formula (D) described below. Mixing and calcination were conducted so as to produce a calcined powder.

$$(Pb_{x-a-d}Bi_aBa_d)\{Ni_b(Ni_{c/3}Zn_{(1-c)/3}Nb_{2/3})_yZr_{1-b-y-z}Ti_z\}O_3 \quad (D)$$

Then, a piezoelectric element (sample) was produced by using the resulting calcined powder in a manner similar to that in Example 1.

TABLE 6

| Sample No. | $(Pb_{x-a-d}Bi_aBa_d)\{Ni_b(Ni_{c/3}Zn_{(1-c)/3}Nb_{2/3})_yZr_{1-b-y-z}Ti_z\}O_3$ | | | | | | | a − 2b | Firing temperature (° C.) | Ag/Pd ratio |
|---|---|---|---|---|---|---|---|---|---|---|
| | a | d | b | c | x | y | z | | | |
| 37 | 0.080 | 0.050 | 0.034 | 0.683 | 0.983 | 0.155 | 0.421 | 0.012 | 940 | 95/5 |
| 38 | 0.080 | 0.100 | 0.034 | 0.683 | 0.983 | 0.155 | 0.411 | 0.012 | 940 | 95/5 |

Regarding each piezoelectric element (sample) produced by using the calcined powder shown in Table 5 and represented by general formula (C) described above, the coercive electric field (Ec) and the piezoelectric constant ($|d_{31}|$) were examined in a manner similar to those in Example 1. Furthermore, the product ($|d_{31}| \times Ec$) of the piezoelectric constant $|d_{31}|$ and the coercive electric field Ec was determined and, in addition, the Curie point Tc was determined. Here, the Curie point Tc was determined by measuring the temperature characteristic of the relative dielectric constant ∈r with an impedance analyzer and calculating a maximum temperature of the relative dielectric constant ∈r.

The results thereof are shown in Table 7.

Asterisked Sample number 34 in Table 7 indicates a comparative example which is out of the scope of the present invention.

TABLE 7

| Sample No. | Coercive electric field Ec (kV/mm) | Piezoelectric constant $|d_{31}|$ (pm/V) | $|d_{31}| \times Ec$ (×10⁻⁶) | Curie point Tc (° C.) |
|---|---|---|---|---|
| 31 | 1.21 | 348 | 421 | 230 |
| 32 | 0.98 | 420 | 412 | 170 |
| 33 | 0.95 | 442 | 420 | 150 |
| 34* | 0.89 | 468 | 417 | 130 |
| 35 | 1.02 | 405 | 413 | 190 |
| 36 | 0.93 | 451 | 419 | 150 |

Regarding each piezoelectric element (sample) produced by using the calcined powder shown in Table 6 and represented by General formula (D) described above, the coercive electric field (Ec) and the piezoelectric constant ($|d_{31}|$) were examined in a manner similar to those in Example 1. Furthermore, the product ($|d_{31}| \times Ec$) of the piezoelectric constant $|d_{31}|$ and the coercive electric field Ec was determined and, in addition, the Curie point Tc was determined. Here, the Curie point Tc was determined by measuring the temperature characteristic of the relative dielectric constant ∈r with an impedance analyzer and calculating a maximum temperature of the relative dielectric constant ∈r. The results thereof are shown in Table 8.

TABLE 8

| Sample No. | Coercive electric field Ec (kV/mm) | Piezoelectric constant $|d_{31}|$ (pm/V) | $|d_{31}| \times Ec$ (×10⁻⁶) | Curie point Tc (° C.) |
|---|---|---|---|---|
| 37 | 0.96 | 421 | 404 | 190 |
| 38 | 0.82 | 490 | 402 | 150 |

Table 7 shows changes in characteristics of each sample of Sample Nos. 31 to 36 in which the amounts of Sr substitution (d) were changed.

When Sample 32 in which the amount of Sr substitution was specified to be 5 percent by mole (d=0.05) was compared with Sample 31 in which Sr substitution was not conducted, it was ascertained that $|d_{31}|$ was improved by about 20% or more in spite of the fact that $|d_{31}| \times Ec$ was not changed significantly.

Regarding Samples 31 to 33 in which the amounts of Sr substitution were within the range of 0 to 10 percent by mole (d=0 to 0.10), $|d_{31}|$ was improved as the amount of Sr substitution increased. However, the Curie point Tc was lower than 150° C. for Sample 34 in which the amount of Sr substitution was specified to be 11 percent by mole (d=0.11). As is clear therefrom, it is not so preferable in practice.

Furthermore, it was ascertained that Sample 35 (d=0.05) and Sample 36 (d=0.10), $|d_{31}|$ were also improved, similarly to Samples 32 and 33, compared with Sample 31 in which Sr substitution was not conducted.

As is clear from the above-described results, in order to realize high $|d_{31}|$, it is desirable that the amount of Sr substitution is specified to be within the range of 0 percent by mole to 10 percent by mole (d=0 to 0.10).

Moreover, Table 8 shows characteristics of Sample 37 (d=0.05) and Sample 38 (d=0.10), in which the amounts of Ba substitution (d) were changed.

It was made clear that in the case where a part of the A site was substituted with Ba as in Sample 37 and Sample 38, $|d_{31}|$ was improved by about 20% or more, as in the case of Sr substitution. From these results, it was ascertained that in the case of Ba substitution, the same effect as that in the case of Sr substitution was exerted.

INDUSTRIAL APPLICABILITY

As described above, the piezoelectric ceramic which can be fired at low temperatures of about 950° C. while a high piezoelectric constant is maintained and which has a high coercive electric field can be obtained according to the present invention.

Furthermore, a piezoelectric element which can obtain a large amount of strain under an alternating current electric field and which exhibits excellent economy can be provided by using the piezoelectric ceramic according to the present invention for the piezoelectric element.

Consequently, the present invention can be widely applied to the field of piezoelectric ceramics and piezoelectric elements including the piezoelectric ceramic.

The invention claimed is:

1. A piezoelectric ceramic characterized by being represented by the general formula,

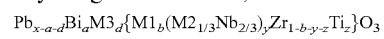
$Pb_{x-a-d}Bi_aM3_d\{M1_b(M2_{1/3}Nb_{2/3})_yZr_{1-b-y-z}Ti_z\}O_3$ where M1 and M2 independently represent at least one of Ni and Zn, and M3 represents at least one of Ba and Sr),
0.05≦a≦0.15,
0≦b≦0.075,
0≦(a−2b),
0≦d≦0.1,
0.97≦x≦1.00,
0.020≦y≦0.250, and
0.398≦z≦0.512.

2. The piezoelectric ceramic according to claim 1, characterized in that $0.015 \leq b \leq 0.075$ and $0 \leq (a-2b) \leq 0.02$.

3. The piezoelectric ceramic according to claim 2, characterized in that M1 is Ni, and M2 is at least one of Ni and Zn.

4. The piezoelectric ceramic according to claim 3, characterized in that Ni is segregated.

5. The piezoelectric ceramic according to claim 3, characterized in that $0.06 \leq a \leq 0.12$, $0.17 \leq b \leq 0.070$, $0.002 \leq (a-2b) \leq 0.017$, $0.978 \leq x \leq 0.990$, $0.045 \leq y \leq 0.219$, and $0.407 \leq z \leq 0.475$.

6. The piezoelectric ceramic according to claim 1, characterized in that M1 is Ni, and M2 is at least one of Ni and Zn.

7. The piezoelectric ceramic according to claim 6, characterized in that Ni is segregated.

8. The piezoelectric ceramic according to claim 1, characterized in that Ni is segregated.

9. A piezoelectric element comprising a piezoelectric ceramic element assembly comprising the piezoelectric ceramic according to claim 8 and having internal electrodes incorporated in the piezoelectric ceramic element assembly.

10. A piezoelectric element according to claim 9 characterized in that the internal electrodes comprise Ag and up to 5 percent by weight of Pd.

11. A piezoelectric element comprising a piezoelectric ceramic element assembly comprising the piezoelectric ceramic according to claim 6 and having internal electrodes incorporated in the piezoelectric ceramic element assembly.

12. A piezoelectric element according to claim 11 characterized in that the internal electrodes comprise Ag and up to 5 percent by weight of Pd.

13. A piezoelectric element comprising a piezoelectric ceramic element assembly comprising the piezoelectric ceramic according to claim 5 and having internal electrodes incorporated in the piezoelectric ceramic element assembly.

14. A piezoelectric element according to claim 3 characterized in that the internal electrodes comprise Ag and up to 5 percent by weight of Pd.

15. A piezoelectric element comprising a piezoelectric ceramic element assembly comprising the piezoelectric ceramic according to claim 3 and having internal electrodes incorporated in the piezoelectric ceramic element assembly.

16. A piezoelectric element according to claim 15 characterized in that the internal electrodes comprise Ag and up to 5 percent by weight of Pd.

17. A piezoelectric element comprising a piezoelectric ceramic element assembly comprising the piezoelectric ceramic according to claim 2 and having internal electrodes incorporated in the piezoelectric ceramic element assembly.

18. A piezoelectric element according to claim 17 characterized in that the internal electrodes comprise Ag and up to 5 percent by weight of Pd.

19. A piezoelectric element comprising a piezoelectric ceramic element assembly comprising the piezoelectric ceramic according to claim 1 and having internal electrodes incorporated in the piezoelectric ceramic element assembly.

20. A piezoelectric element according to claim 19 characterized in that the internal electrodes comprise Ag and up to 5 percent by weight of Pd.

* * * * *